US009832899B1

(12) United States Patent
Brown et al.

(10) Patent No.: US 9,832,899 B1
(45) Date of Patent: Nov. 28, 2017

(54) SIDE CLAMPING BGA SOCKET

(71) Applicant: ALCATEL-LUCENT CANADA INC., Ottawa (CA)

(72) Inventors: Paul J. Brown, Wakefield (CA); Alex L. Chan, Ottawa (CA)

(73) Assignee: ALCATEL LUCENT, Boulogne-Biilancourt (FR)

( * ) Notice: Subject to any disclaimer, the term of this patent is extended or adjusted under 35 U.S.C. 154(b) by 0 days.

(21) Appl. No.: 15/140,146

(22) Filed: Apr. 27, 2016

(51) Int. Cl.
| | |
|---|---|
| H01R 11/22 | (2006.01) |
| H05K 7/10 | (2006.01) |
| H01L 23/498 | (2006.01) |
| H01R 13/11 | (2006.01) |
| H01R 12/71 | (2011.01) |
| H01R 13/629 | (2006.01) |
| H01R 12/70 | (2011.01) |

(52) U.S. Cl.
CPC ..... *H05K 7/1007* (2013.01); *H01L 23/49816* (2013.01); *H01R 12/7076* (2013.01); *H01R 12/716* (2013.01); *H01R 13/11* (2013.01); *H01R 13/62905* (2013.01)

(58) Field of Classification Search
CPC   H05K 7/1007; H01R 13/11; H01R 13/62905; H01R 12/7076; H01R 12/716; H01L 23/49816
USPC ......................................................... 439/268
See application file for complete search history.

(56) References Cited

U.S. PATENT DOCUMENTS

| | | | | |
|---|---|---|---|---|
| 3,192,445 | A * | 6/1965 | Evans .................... | H01R 23/68 361/732 |
| 3,510,718 | A * | 5/1970 | Vetere ....................... | H01J 5/56 313/317 |
| 8,267,701 | B2 * | 9/2012 | Beaman et al. .... | H01L 23/4006 439/68 |
| 8,419,460 | B2 * | 4/2013 | Tsai ..................... | H01R 13/193 439/342 |

(Continued)

*Primary Examiner* — Jean F Duverne
(74) *Attorney, Agent, or Firm* — Kramer & Amado, P.C.

(57) ABSTRACT

Disclosed is a socket apparatus for gripping the balls of a ball grid array (BGA), including a base member of electrically insulative material, an array of pairs of electrical contacts disposed in the base member in a configuration corresponding to a terminal ball configuration of said BGA to be mated with the socket apparatus, a first plate member disposed for slidable movement on said base member and having a plurality of parallel extension members extending therefrom and configured to pass through the array of pairs of electrical contacts, a second plate member disposed for slidable movement on said base member and having a plurality of parallel extension members extending therefrom and configured to pass through the array of pairs of electrical contacts, the plurality of parallel extension members of said first plate member disposed between the plurality of parallel extension members of said second plate member, a plurality of insulative nodules disposed on each extension member with nodules forming an array corresponding to said array of pairs of electrical contacts, and the first plate member and second plate member being movable relative to each other on said base member whereby the plurality of insulative nodules urge the corresponding electrical contacts into electrical contact engagement with the balls of a BGA in the socket.

20 Claims, 8 Drawing Sheets

(56) References Cited

U.S. PATENT DOCUMENTS

2002/0181839 A1\* 12/2002 Brown ................. G02B 6/3572
　　　　　　　　　　　　　　　　　　　　　385/16
2004/0137774 A1\* 7/2004 Shimizu ................. H01R 12/88
　　　　　　　　　　　　　　　　　　　　　439/268

\* cited by examiner

SIDE CLAMPING BGA SOCKET

FIELD OF THE INVENTION

Embodiments described herein relate generally to the field of integrated circuits and more particularly to apparatuses and methods of mounting a ball grid array package (BGA) on a socket.

BACKGROUND OF THE INVENTION

In the packaging of integrated circuit devices, including processors, memory devices, and other integrated circuits, the use of BGAs has become increasingly popular by permitting a high density of inter-connections. BGAs provide a relatively low package profile and have very short lead lengths which provide improved electrical characteristics. BGAs may be utilized in multiple chip devices. Usually, balls or bumps of a BGA (BGA balls) are soldered to an array of pads on a printed circuit board for permanent connection to leads extending to other circuitry. However, in many instances, particularly during prototype debugging or burn-in, BGA's may be removably placed in a socket for testing or operations.

BGA sockets have been available for several years. Ordinarily, these sockets include a printed circuit board having an array of electrically conductive pads on its surface. The pads match the arrangement of the BGA balls on the BGA to be inserted. The BGA is then placed in the socket and is vertically pressed against the array of pads by a force normal to the package itself. In order to guarantee electrical contact, the typically required pressure load applied to contacts is about 50 to 100 grams per contact. Therefore, when there are high BGA ball counts, the mechanism to apply a uniform force may be large and cumbersome. Slight variations in the size of the BGA balls can require particularly excessive force, sufficient to deform the BGA balls so as to force all of the BGA balls into contact with the underlying pads.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Various embodiments described herein relate a socket apparatus for gripping balls of a ball grid array (BGA), including a base member of electrically insulative material, an array of pairs of electrical contacts disposed in the base member in a configuration corresponding to a terminal ball configuration of said BGA to be mated with the socket apparatus, a first plate member disposed for slidable movement on said base member and having a plurality of parallel extension members extending therefrom and configured to pass through the array of pairs of electrical contacts, a second plate member disposed for slidable movement on said base member and having a plurality of parallel extension members extending therefrom and configured to pass through the array of pairs of electrical contacts, the plurality of parallel extension members of said first plate member disposed between the plurality of parallel extension members of said second plate member, a plurality of insulative nodules disposed on each extension member with nodules forming an array corresponding to said array of pairs of electrical contacts, and the first plate member and second plate member being movable relative to each other on said base member whereby the plurality of insulative nodules urge the corresponding electrical contacts into electrical contact engagement with the balls of the BGA in the socket.

The plurality of parallel extension members of said first plate member may be interleaved with the plurality of parallel extension members of said second plate member.

The extension members and nodules may be made of an insulating material.

The slidable movement may be along a lengthwise direction of an extension member.

The pairs of electrical contacts may be made of a flexible conductor that flexes when contacted by the nodules.

The pairs of electrical contacts may have a concave surface that contacts the balls of the BGA in the socket.

The plurality of nodules may extend in a plurality of nodule columns and the pairs of electrical contacts extend in a plurality of electrical contact columns wherein the nodule columns are interleaved with the electrical contact columns. A nodule may engage one electrical contact from one column of the pairs of electrical contacts while engaging another electrical contact from another column of the pairs of electrical contacts.

A cam member may be mounted on a side opposite the base member from the extension members, the cam member configured to push the first plate member and second plate member away from each other.

At least one screw member may be affixed to the socket apparatus to move at least one of the first plate member and second plate member relative to each other.

The balls of the BGA may be secured to the socket apparatus by lateral forces applied by the corresponding electrical contacts.

The nodules may be substantially round. The nodules may be substantially triangular.

Various embodiments described herein also relate a method of securing a ball grid array (BGA) to a socket including a base member of electrically insulative material, an array of pairs of electrical contacts disposed in the base member in a configuration corresponding to a terminal ball configuration of said BGA to be mated with the socket, a first plate member disposed for slidable movement on said base member and having a plurality of parallel extension members extending and configured to pass through the array of pairs of electrical contacts, a second plate member disposed for slidable movement on said base member and having a plurality of parallel extension members extending therefrom and configured to pass through the array of pairs of electrical contacts, the plurality of parallel extension members of said first plate member disposed between the parallel extension members of said second plate member, a plurality of insulative nodules disposed on each extension member with nodules forming an array corresponding to said array of pairs of electrical contacts, and the first plate member and second plate member being movable relative to each other on said base member whereby the plurality of insulative nodules urge the corresponding electrical contacts into electrical contact engagement with the balls of the BGA in the socket, the method including placing the BGA into the socket, and moving the first plate member and second plate member are relative to each other to urge the corresponding electrical contacts into electrical contact engagement with the balls of the BGA and secure the BGA to the socket.

At least one of the first and second plate members may be moved using a cam member.

At least one of the first and second plate members may be moved using a screw member.

The method may include securing the balls of the BGA to the socket by lateral forces applied by the corresponding electrical contacts.

The slidable movement may be along a lengthwise direction of the extension members.

The method includes flexing the electrical contacts when the electrical contacts are contacted by the nodules.

The extension members and nodules may be made of an insulating material.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

DETAILED DESCRIPTION

Figure 1:
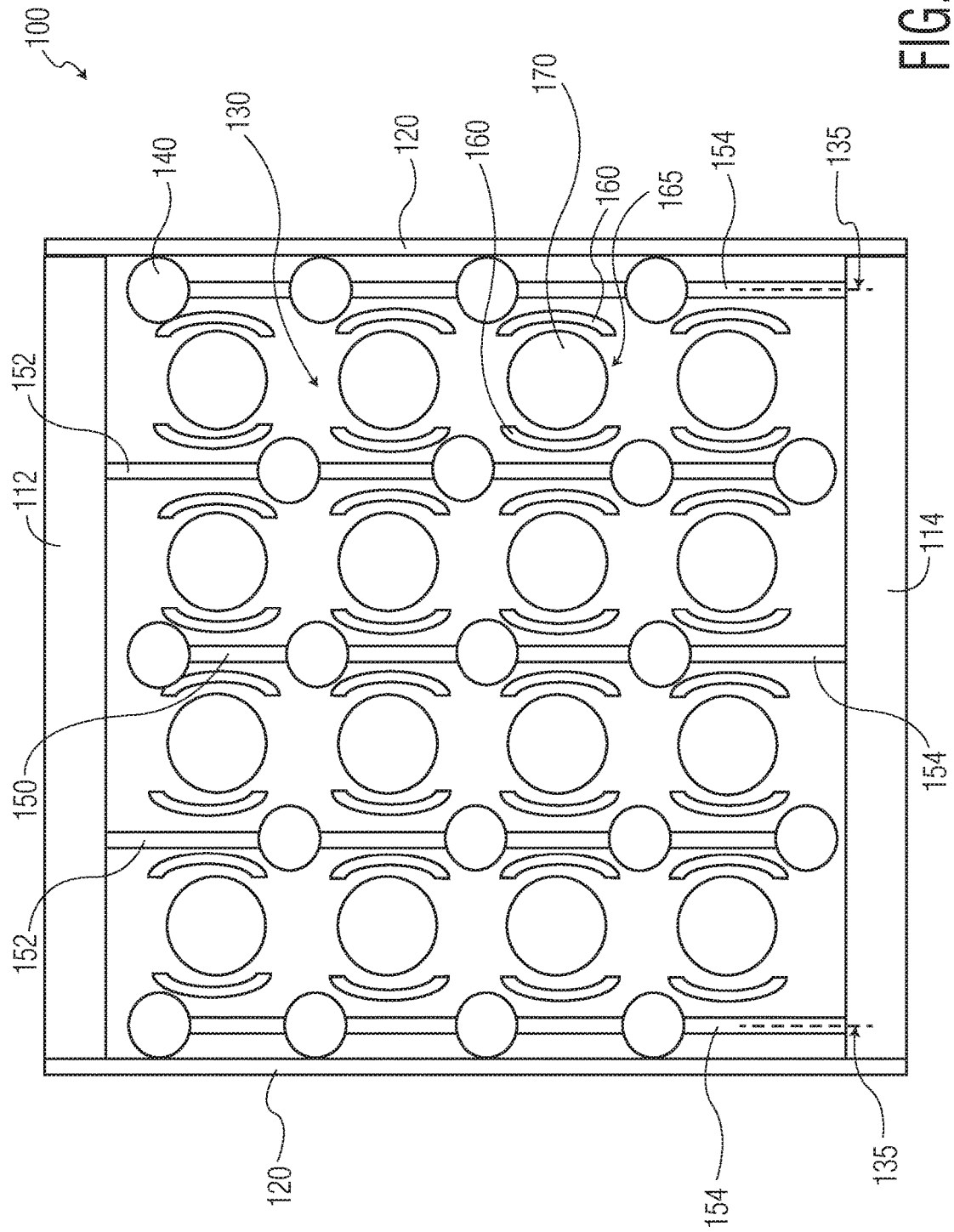
FIG. 1 illustrates a plan view of a socket apparatus positioned under BGA balls in an open position in accordance with embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated. The terms "first," "second," "third," etc. are used as designators to aid the reader, are not meant to be limiting terms, and may generally be interchanged.

The terms "rows" and "columns" here are interchangeable and are only used for reference and are not meant to permanently affix a directional configuration to components of the socket apparatus 100 and are not meant to take away or limit the concepts described herein in any way. The same holds true for other features described herein such as "wall" or "plate." Unless otherwise described by more limiting features, such terms are interchangeable and are merely used to aid the reader in distinguishing one device component from another.

Soldering a BGA package to a printed circuit board (PCB) is a way to obtain electrical connection while minimizing additional mechanical overhead. Once soldered to a PCB or underlying substrate material, specialized factory based equipment is needed to remove or replace the BGA and these replacements are then limited in most cases to a small number of remove/replace cycles due to thermal, mechanical, and electrical degradation of the assembly. As a result, additional time and cost are needed throughout product development to include product repair and upgrade.

One solution places BGA chips into sockets that overcome this shortfall by providing a non-soldered electrical connection between a BGA chip and a socket that is held together using a vertical clamping force apparatus. As a result BGAs can be removed and replaced at any time with the use of simple hand tools. While they present many notable advantages to product designers such as solderless connection, rapid chip replacement, upgrading, and field replacement, vertical compression mounting schemes used on socket packages introduce an equal number of disadvantages thereby relegating their use to very narrow segments of the industry.

Vertical compression schemes, which essentially compress the BGA to the socket by sandwiching it between a bottom bolster plate and a top plate or heat sink, introduces substantial force normal to the plane of the BGA chip that must be channeled through the package. Even though individual contact forces are relatively negligible, when multiplied by the sheer number of BGA balls on larger BGAs (1000, 2000 or event 3000+) the forces may be substantial (200-300 lbs).

With these constraints, chip vendors have concerns about applying this amount of force on a package that threaten to nullify positive device characteristics such as reliability. Separate extensive tests or evaluations are therefore needed to validate reliability, with any risk being assumed by the user. Additionally, to generate and maintain such high forces, substantial hardware is needed such as screw mounts to a bottom side bolster plate. This hardware consumes both internal routing real estate due to the holes needed for the screws, as well as the vast majority of bottom side real estate, owing to the bolster plate itself. Bottom side real estate comes at a direct cost to chip decoupling capacitors and termination resistors, something that has proved unacceptable in past evaluations.

Embodiments described herein include a socket apparatus that provides the benefits of a traditional BGA socket, without the drawbacks of vertical compression mounting, by using a lateral loading mechanism. By clamping on the BGA balls from the side, rather than vertically, two contact points may be used on either side of a BGA ball, cancelling out the net stress or loading effect on the BGA package. In this way, BGA package reliability remains uncompromised. No vertical loading, no loading over the die area, and minimum hardware are required to anchor the socket apparatus to the bottom side of a BGA chip, thereby eliminating any impact to the real estate directly under the BGA (both internal to the circuit card and on the opposite external side of the circuit card).

FIG. 1 illustrates a plan view of a socket apparatus 100 positioned under BGA balls 170 in an open position in accordance with embodiments described herein. The socket apparatus 100 may include a first plate 112 and a second plate 114 disposed at opposing sides of the socket apparatus 100 in a parallel manner. Adjacent to the first plate 112 and second plate 114 are walls 120. First plate 112 and second plate 114, and walls 120 may be mounted on a base member 130 of electrically insulative material and form a periphery of the socket apparatus 100. Disposed between the first plate 112 and second plate 114 are a plurality of nodules 140 made of an insulating, non-conductive material, such as polymer, elastomer, or the like. The nodules 140 may be disposed throughout the socket apparatus 100 along reference lines 135 between the first plate 112 and second plate 114, and walls 120. The socket apparatus 100 may also include a plurality of electrical contact members 160 that may be arranged in pairs and are flexibly attached to the base member 130. Thus the pairs of electrical contacts members 160 may be made of a flexible conductor that flexes when contacted by the nodules 140. The pairs form contact areas 165 in the form of a void or gap in which to load a BGA ball 170. The contact areas may also be referred to as gaps or voids. The electrical contact members 160 may include a pair of contacts that surround contact areas 165 and are respectively conductively coupled to each other, but not to other contact pairs.

The socket apparatus 100 may include a plurality of extension members 150 that are fixedly attached to the first plate 112 and second plate 114 in an alternating parallel and interleaved fashion. The extension members 150 may also be referred to as rods. The extension members 150 may also be formed integral with the first plate 112 and second plate 114. The extension members 150 may be made of a non-conducting material, and may be formed of the same material as the nodules 140. The extension members 150 may include a first set of extension members 152 attached to the first plate 112, and a second set of extension members 154 connected to the second plate 114.

When a BGA chip or package is inserted or mounted onto the socket apparatus 100, the nodules 140 of the socket apparatus 100 may be moved in a lengthwise direction along the reference lines 135 in order to push or press the electrical contact members 160 into physical and electrical contact with the BGA balls 170. In embodiments described herein, a number of nodules 140 may be greater than a number of contact areas 165 in a socket apparatus 100.

When the nodules 140 are pressed against the electrical contact members 160, the BGA packages that the BGA balls 170 are attached to are firmly held using lateral compression or lateral force applied to sides of BGA balls 170, eliminating the need to use a vertical clamp that can place harmful force on the top of a BGA package including the chips therein. Further, the lateral forces applied to each of the BGA balls 170 may be opposite to one another, thus substantially cancelling one another. This results in very little to no lateral force being applied to the BGA balls 170.

FIG. 1 illustrates a limited number of extension members 150, nodules 140, electrical contact members 160 and BGA balls 170. It should be understood that the design described herein may be used for BGA packages and sockets that have BGA balls numbering in the hundreds to thousands, depending on the complexity of an integrated circuit and the number of connections thereto.

In embodiments described herein, after a BGA package or chip is loaded onto a socket apparatus 100, the first plate 112 with first extension members 152 are moved towards or away from the second plate 114 with second extension members 154 so that nodules 140 in adjacent columns are moved toward each other along a column direction. As illustrated in FIG. 1, the nodules 140 are fixedly attached to, or form a part of the extension members 150.

Figure 2:
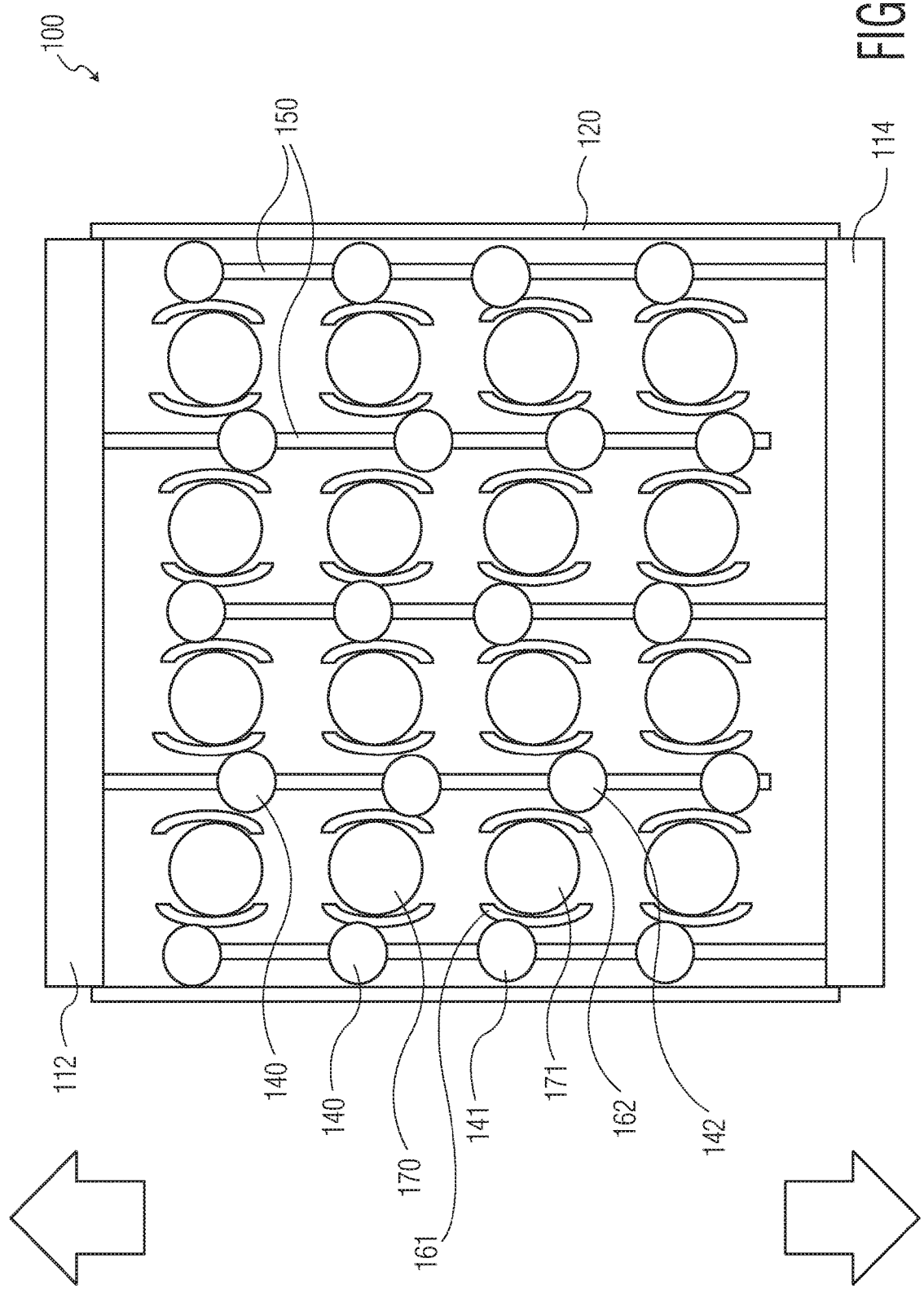
FIG. 2 illustrates the socket apparatus of FIG. 1 positioned under BGA balls in closed position in accordance with embodiments described herein.

FIG. 2 illustrates a socket apparatus 100 of FIG. 1 positioned under BGA balls 170 in closed position in accordance with embodiments described herein. Embodiments described herein apply lateral holding forces to the BGA balls 170 of a BGA chip. To do this, several mechanical apparatus and methods may be used to pull the first plate 112 and the second plate 114 apart in order to wedge the nodules 140 into contact with the electrical contact members 160. Comparing FIG. 1 and FIG. 2, nodule 141 has been pulled by the second plate 114 to create a physical and electrical contact between contact member 161 and BGA ball 171. Similarly, nodule 142 has been pulled by the first plate 112 to create a physical and electrical contact between contact member 162 and BGA ball 171. Thus, the first extension members 152 and second extension members 154 supply force to the nodules 140 in the lengthwise direction. The nodules 140 translate these forces into lateral forces that are applied to the electrical contact members 160, and then from the electrical contact members 160 to the BGA balls 170. The BGA balls are secured by the mechanical forces applied by the electrical contact members. As illustrated in FIG. 2, the first plate 112 and the second plate 114 are configured to slide along walls 120 to facilitate movement of extension members 150.

As illustrated in FIGS. 1 and 2, the electrical contact members 160 are disposed in columns and rows in the socket apparatus 100. The layout of the electrical contact members 160 are designed to coincide with corresponding BGA ball 170. The nodules 140 and electrical contact members 160 of the socket apparatus 100 are disposed in a manner such that when the first plate 112 and second plate 114 are moved towards or apart from each other, a single nodule 140 contacts one electrical contact member 160 in one contact pair column, and a separate electrical contact member 160 in another contact pair column.

As illustrated in FIGS. 1 and 2, the shape of the electrical contact members 160 is concave on the side of the electrical contact members 160 directly adjacent and abutting the BGA balls 170, and convex on the sides of the electrical contact members 160 adjacent and abutting the nodules 140. When pushed into contact with BGA balls 170 by nodules 140, a pair of electrical contact members 160 may partially wrap around the BGA balls 170 to form close contact and establish a reliable electrical connection between BGA balls 170 and an underlying printed circuit board mounted in a test circuit or device.

As illustrated in FIGS. 1 and 2, electrical contact members 160 are spaced apart sufficiently to accommodate the BGA ball 170 between them when in the open position. The series of extension members 150 may be configured as rods that run between adjacent columns of electrical contact member pairs, and the extension members 150 may have the nodules formed thereon or there from. The extension members 150 and nodules 140 may be elevated above the base member 130 or guided along the base member 130 in tracks or grooves. The termination of these rods 150 alternate from column to column, with a connection to the first plate 112 and the second plate 114, such that if a first rod terminates on the first plate 112, the second adjacent rod would terminate on the opposite side to the second plate 114. Each rod 150 may be constructed to support nodules 140 along the length thereof that correspond to the BGA ball 170 pitch, so that for every BGA ball 170 there is at least one nodule 140.

The geometry of the nodules 140 directly affect the loading force profile of the BGA balls 170 and may be used to generate side loading instead of vertical loading as present in other devices. In embodiments described herein, nodules 140 on rods 150 are moved from a non-contacting position as illustrated in FIG. 1 into a contacting position as illustrated in FIG. 2. In FIG. 2, either one of the first plate 112 or second plate 114 may be moved away from the opposite plate, while the opposite plate is held stationary in order to move the nodules 140 and press the electrical contact members 160 against the BGA balls 170. Both first plate 112 and second plate 114 may also be moved toward each other in order to move the nodules 140 and press the electrical contact members 160 against the BGA balls 170. This pressing establishes electrical contact between a BGA package and the socket apparatus 100 that is mounted to a printed circuit board or like apparatus. Also, as described above, both first plate 112 and second plate 114 may be moved apart from each other to move nodules 140 against the electrical contacts members 160 to establish electrical contact with the BGA balls 170.

The electrical contact members 160 may be electrically connected through the base member 130 of the socket apparatus 100 to additional electronic components on the bottom of the socket apparatus 100 to establish electrical contact between a BGA package and an underlying circuit board or the like.

Figure 3:
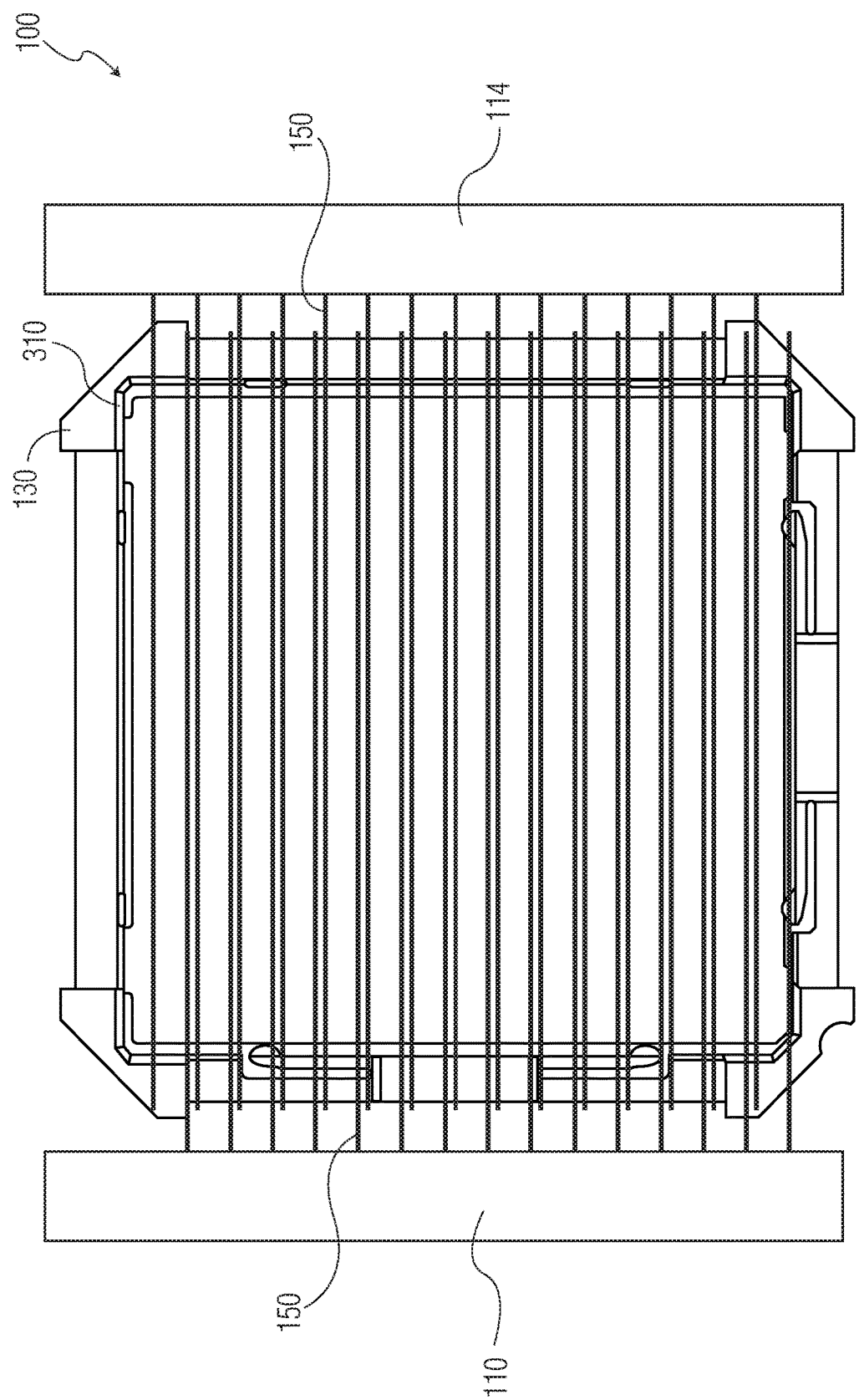
FIG. 3 illustrates a top view of a socket apparatus having plates and extension members paired with a BGA package outline in accordance with embodiments described herein.

FIG. 3 illustrates a top view of a socket apparatus having plates and extension members paired with a BGA package outline 310 in accordance with embodiments described herein. FIG. 3 illustrates a top view of a socket apparatus 100 having first plate 112 and second plate 114 and extension members 150 as they would appear over the base member 130. In accordance with embodiments described herein, there are a variety of different mechanisms that can be used to pull the first plate 112 and second plate 114 apart or push them together to wedge the nodules into place.

Figure 4:
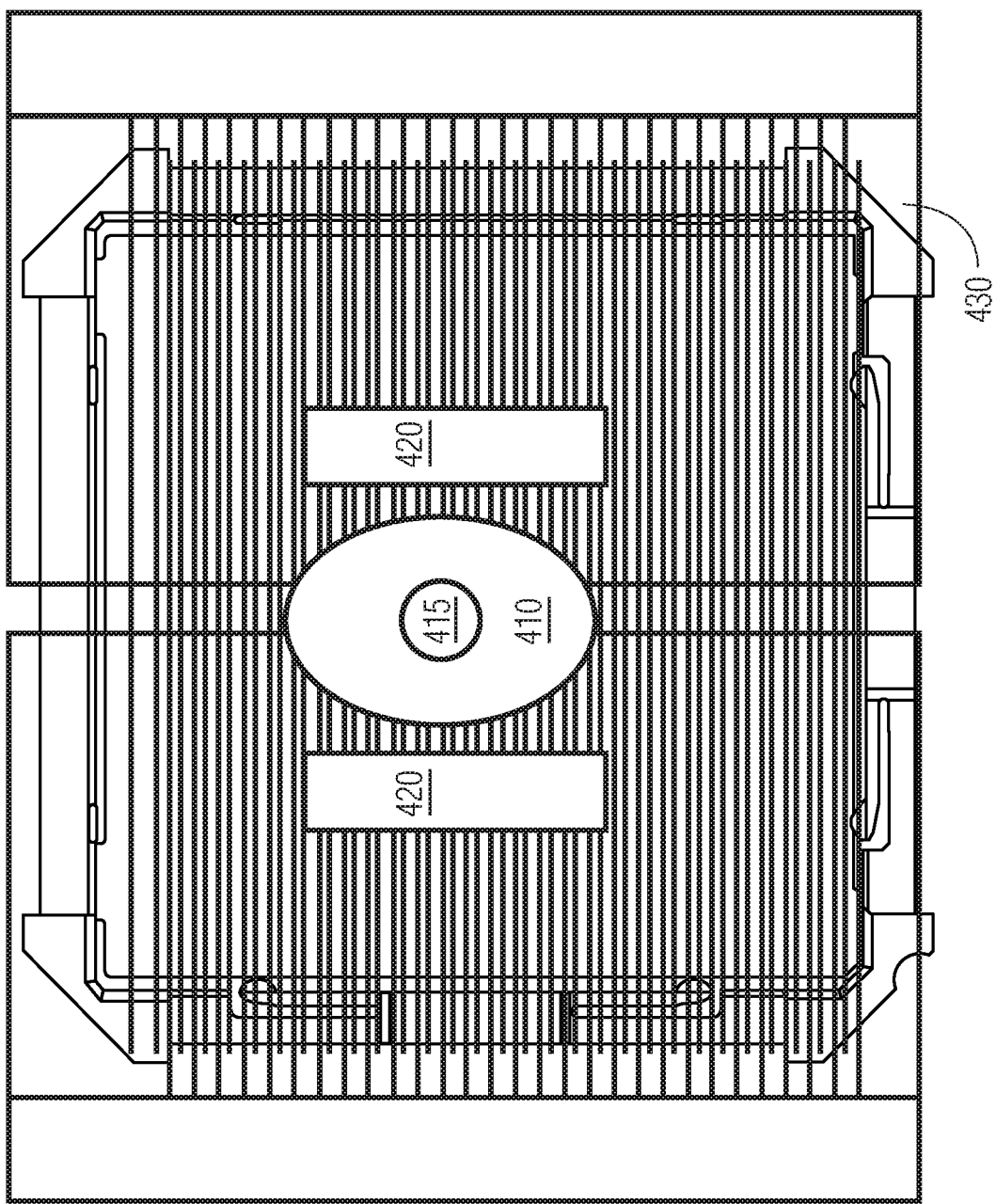
FIG. 4 illustrates a starting position of a cam member for the socket apparatus of FIG. 3 in accordance with embodiments described herein.
Figure 5:
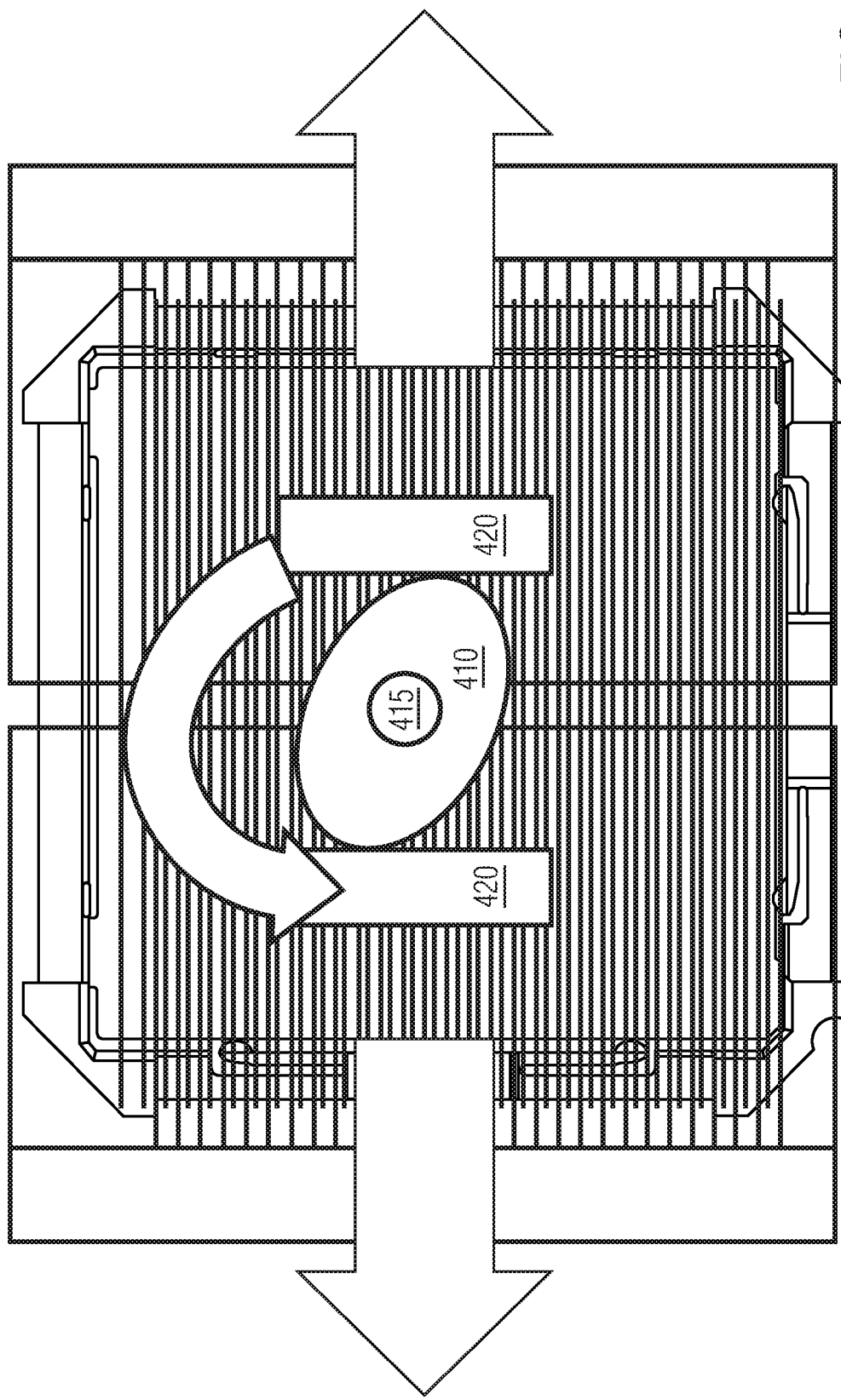
FIG. 5 illustrates an engaged position of the cam member for the socket apparatus of FIG. 3.

FIG. 4 illustrates a starting position of a cam member 410 for the socket apparatus of FIG. 3 in accordance with embodiments described herein. In an initial position illustrated in FIG. 4, nodules (not illustrated) are not applying a force on the electrical contact member pairs. The cam member 410 may include a thumbscrew 415 to allow a user to operate the cam member to turn the cam member 410 against abutting members 420 fixed to a side 430 of the base member opposite the extension members. As illustrated in FIG. 5, the cam member 410 may be adjusted until the BGA balls 170 are held firmly in place by the nodules 140.

FIG. 5 illustrates an engaged position of the cam member 410 for the socket apparatus of FIG. 5. In FIG. 5 the first plate 112 and second plate 114 are distanced from each other and the nodules 140 are forced into conductive contact as previously described in relation to FIG. 2.

Figure 6:
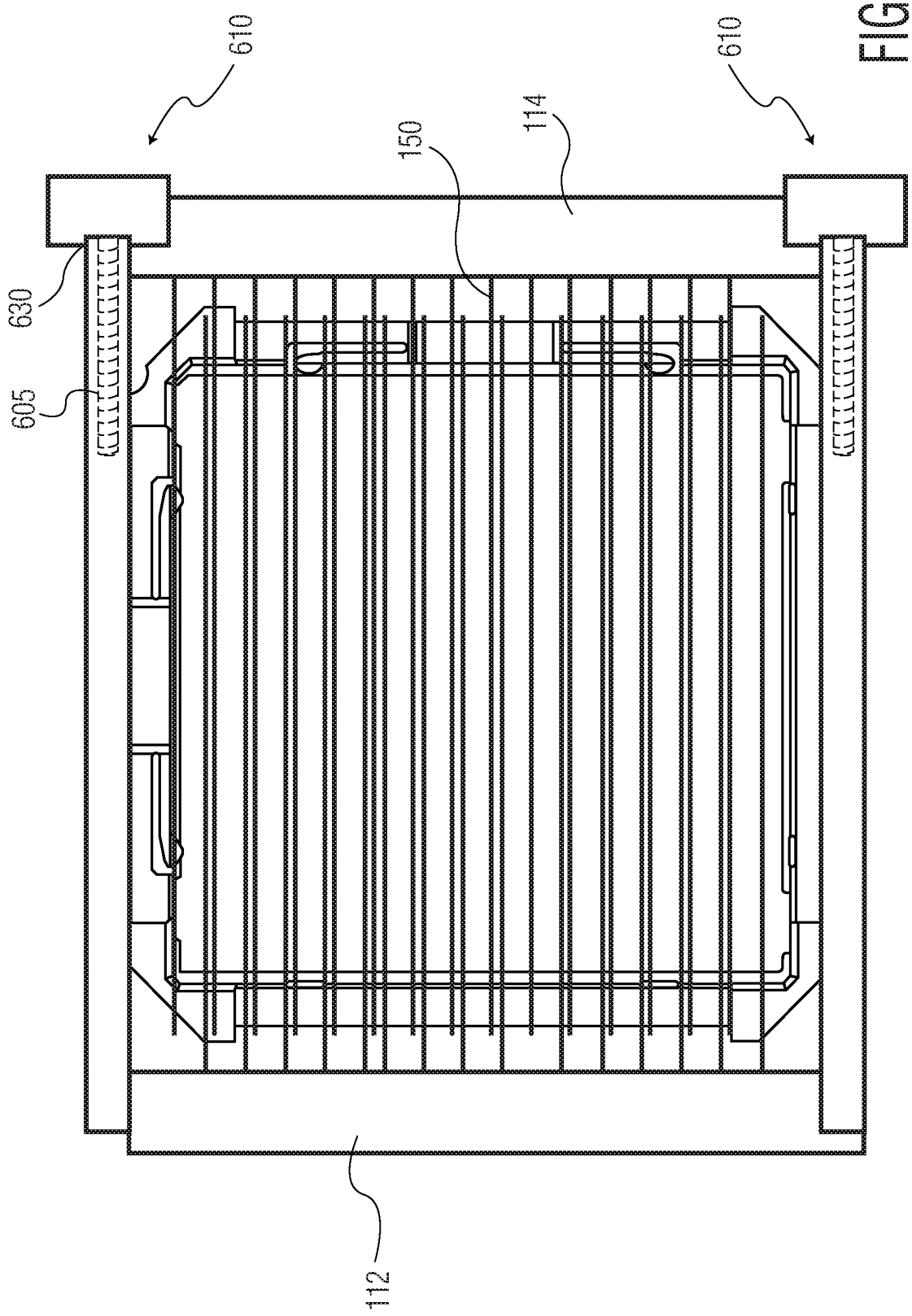
FIG. 6 illustrates an alternate embodiment for moving the plates of the socket apparatus of FIG. 3 in accordance with embodiments described herein.

FIG. 6 illustrates an alternative embodiment for moving the first plate 112 and second plate 114 of the socket apparatus of FIG. 3 into position to engage the BGA balls 170 in accordance with embodiments described herein. As illustrated in FIG. 6, a pair of threaded screw members 610 having threads 605 may be inserted into housings 630 of the socket apparatus 100. Housings 630 are affixed to one of the first plate 112 and second plate 114 such that rotation of threaded screw members 610 will bring the first plate 112 and the second plate 114 into position such that nodules (not illustrated in this figure) attached to extension members 150 may engage the BGA balls as described herein. The threaded screw members 610 may be used to push or pull the first plate 112 and the second plate 114 relative to each other. In addition to mechanical apparatuses such as the cam member 410 and screw members 610, it is contemplated that the first plate 112 and the second plate 114 may also be moved by any other mechanical apparatus or methods known in the art to achieve sufficient lateral force on the BGA balls 170 being brought to bear via the mechanism of the nodules pressing upon respective electrical contact pairs.

Figure 7:
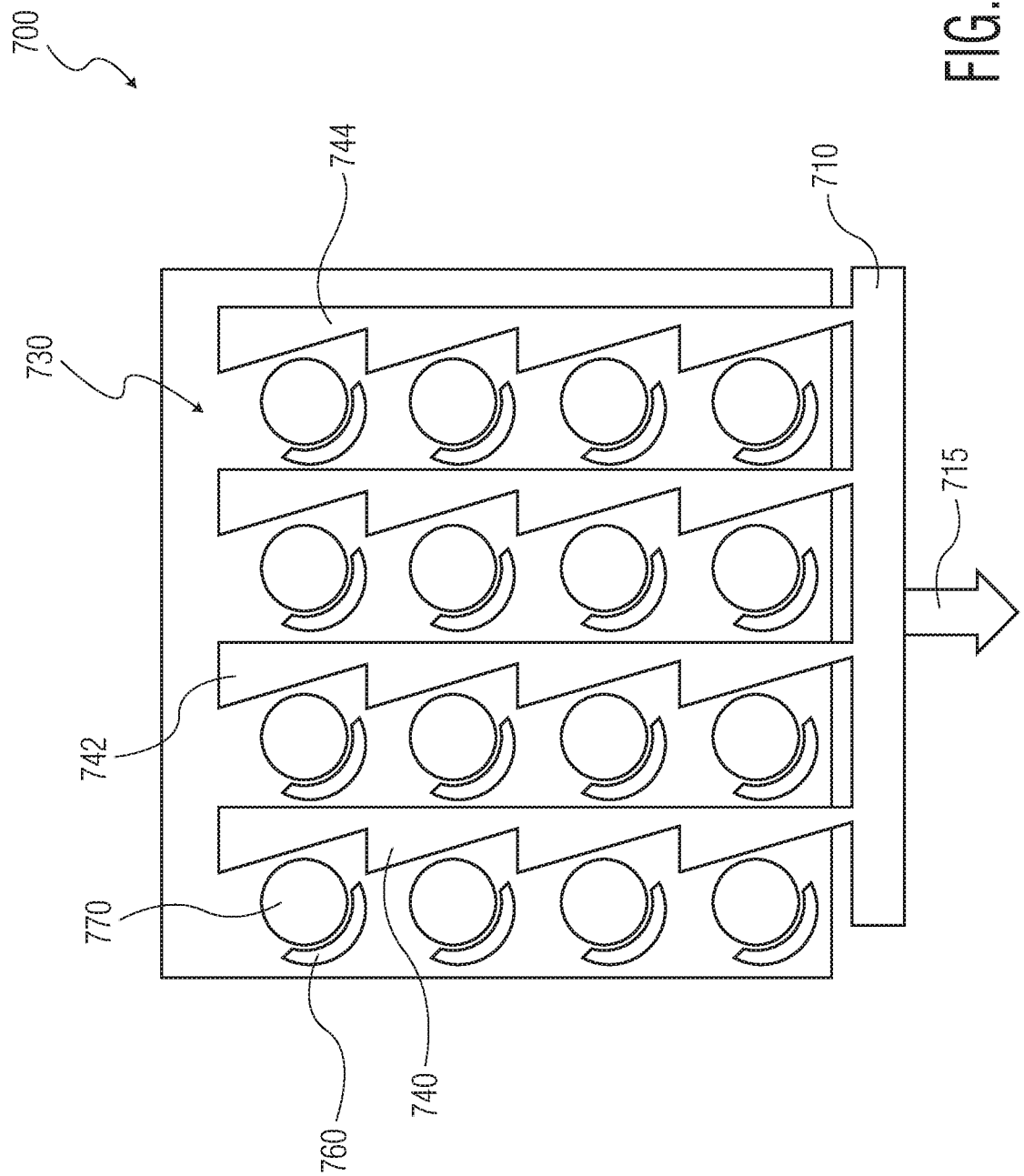
FIG. 7 illustrates another embodiment of a socket apparatus positioned under BGA balls in accordance with embodiments described herein.

FIG. 7 illustrates another embodiment of a socket apparatus 700 positioned under BGA balls in accordance with embodiments described herein. FIG. 7 illustrates a socket apparatus 700 including a single electrical contact member 760 per BGA ball 770. The socket apparatus 700 includes a plurality of triangle shaped wedges 740. The wedges 740 may have a wide end 742 that tapers down to a narrow portion 744. When a plate member 710 is pulled in the direction of the arrow 715, the wedges 740 may push BGA balls 770 of a BGA package into the electrical contact members 760 mounted on a base member 730 of the socket apparatus 700. Alternatively, the electrical contact members 760 may be rotated 180 degrees on the base member 730 so that the electrical contact members 760 are pressed by the laterally moving wedge members 740, instead of the BGA balls 770.

Figure 8:
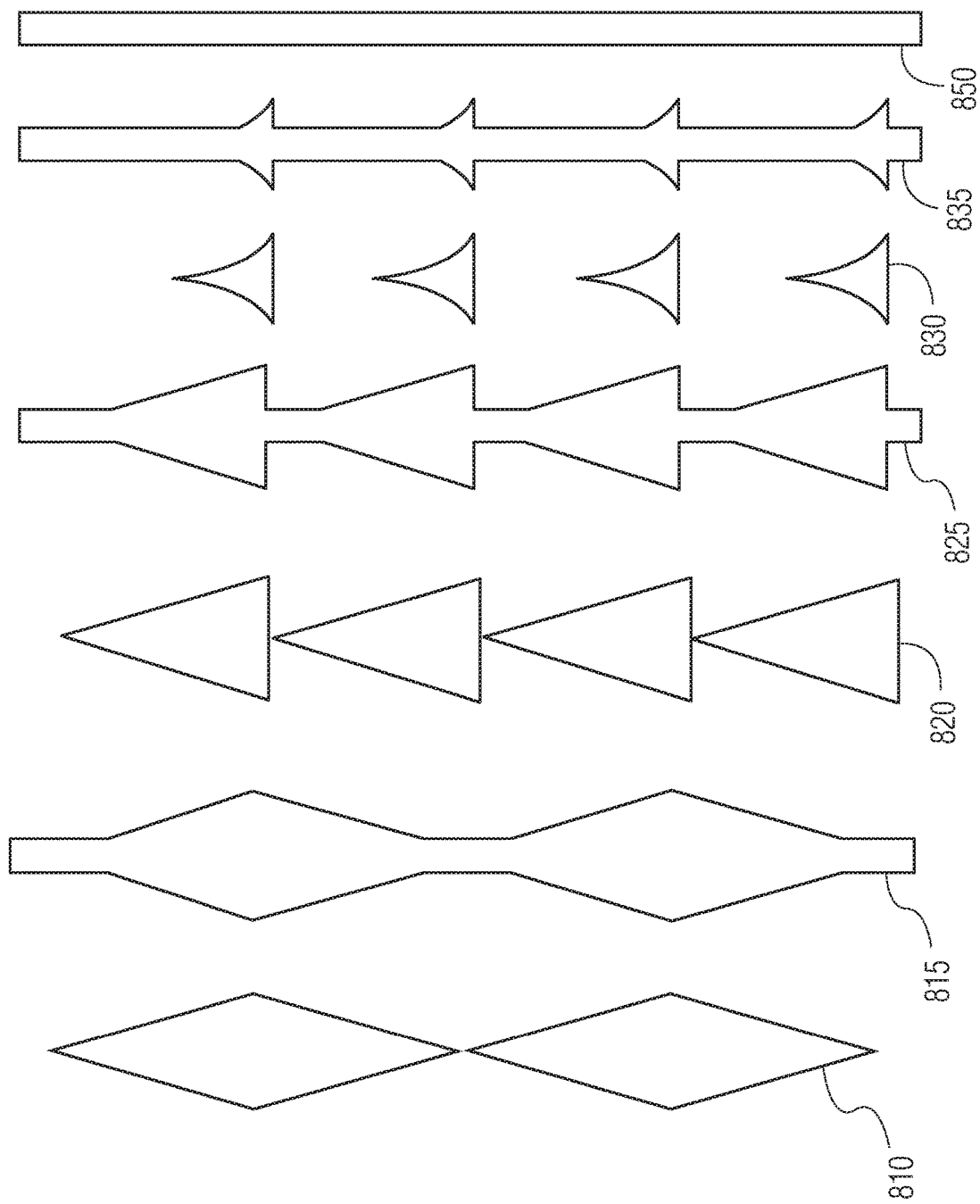
FIG. 8 illustrates alternative shapes of nodules and nodules on extension members in accordance with embodiments described herein.

FIG. 8 illustrates alternative shapes of the nodules and nodules on extension members in accordance with embodiments described herein. As illustrated in FIGS. 1 and 2, the nodules 140 may take a substantially circular or substantially round shape, but embodiments described herein are not limited thereto. Nodules 140 may take on a substantially diamond shape 810, a substantially triangular wedge shape 820, both of which may be mounted to rods 850 to form alternative extension member combinations 815 and 825. The nodules may also take a curved shape 830 that may conform to the curvature of the electrical contacts and combine with extension member 850 to form structure 835. Other shapes as may be contemplated by those skilled in the art to achieve the desired effect of moving the nodules 140 and pressing the electrical contact members 160 against the BGA balls 170.

Referring to FIGS. 1 and 2, a method of mounting a BGA package to the socket apparatus 100 will now be described. Once a determination or a design has been made to match the pitch of BGA balls 170 with the contact areas 165 on the base member 130 of a socket apparatus 100, a BGA chip is held in place over the socket apparatus 100. Once the BGA is placed on top of the socket apparatus 100, with each BGA ball 170 nestled between an electrical contact members 160, opposing first plate 112 and second plate 114 are pulled apart (or forced together) driving the nodules 140 between the adjacent electrical contact members 160 to wedge the individual contacts of the electrical contact members 160 against the side of the BGA balls 170, in a closed position.

In accordance with embodiments described herein, a socket apparatus 100 is provided in which the loads are applied parallel to the printed circuit board itself rather than normal to it. Each of the individual BGA balls makes electrical connection with an electrical contact member 160 disposed on a base member 130 of the socket apparatus 100.

One or more electrical contact members 160 may be resiliently urged against the sides of the BGA balls 170.

The overall package may have a very low profile enabling the socket to be used in prototype system environments without modifying the system to accommodate mechanical clamps. Moreover, the top of the package, unlike the usual test and burn-in sockets for BGA's, is not blocked. Therefore, production heat sinks can be employed directly on the package. Further the embodiments described herein may be used in production systems allowing for easy swapping of components.

Embodiments described herein include a socket apparatus 100 that uses a lateral mounting mechanism, thereby avoiding issues introduced by vertical compression mounting.

A test socket for BGA packages for integrated circuits is described. The socket includes a package to receive BGA balls between two electrical contacts. The BGA balls may also be received between at least one electrical contact and at least one non-conductive member. The receptacles have opposing plates with extension members connected there between and one or both of the opposing plates moves in a lengthwise direction of the extension members. The one or two plates may press the non-conductive members into electrical contacts in order to physically and electrically connect the electrical contacts to a BGA ball. The BGA is then firmly secured to the socket, using a lateral force rather than the vertical force that is used in other device packages.

According to embodiments described herein, the amount of on-socket real estate may be increased, not needing attachment mechanisms that have previously been used for vertical mounting apparatuses and clamps. More socket space may allow a greater number of conductive pairs to be formed to enable larger BGAs to be attached to socket apparatuses using the designs described herein. Also, because vertical attachment mechanisms may no longer be needed, a top of a BGA may be more directly connected to heat sink implements, which can increase heat dissipation and lower operating temperatures of a circuit using the lateral loaded BGA socket described herein.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A socket apparatus for gripping balls of a ball grid array (BGA), comprising:
   a base member of electrically insulative material;
   an array of pairs of electrical contacts disposed in the base member in a configuration corresponding to a terminal ball configuration of said BGA to be mated with the socket apparatus;
   a first plate member disposed for slidable movement on said base member and having a plurality of parallel extension members extending therefrom and configured to pass through the array of pairs of electrical contacts;
   a second plate member disposed for slidable movement on said base member and having a plurality of parallel extension members extending therefrom and configured to pass through the array of pairs of electrical contacts;
   the plurality of parallel extension members of said first plate member disposed between the plurality of parallel extension members of said second plate member;
   a plurality of insulative nodules disposed on each extension member with nodules forming an array corresponding to said array of pairs of electrical contacts; and
   the first plate member and second plate member being movable relative to each other on said base member whereby the plurality of insulative nodules urge the corresponding electrical contacts into electrical contact engagement with the balls of the BGA in the socket.

2. The socket apparatus of claim 1, wherein the plurality of parallel extension members of said first plate member are interleaved with the plurality of parallel extension members of said second plate member.

3. The socket apparatus of claim 1, wherein the extension members and nodules are made of an insulating material.

4. The socket apparatus of claim 1, wherein the slidable movement is along a lengthwise direction of an extension member.

5. The socket apparatus of claim 1, wherein the pairs of electrical contacts are made of a flexible conductor that flexes when contacted by the nodules.

6. The socket apparatus of claim 1, wherein the pairs of electrical contacts have a concave surface that contacts the balls of the BGA in the socket.

7. The socket apparatus of claim 1, wherein the plurality of nodules extend in a plurality of nodule columns and the pairs of electrical contacts extend in a plurality of electrical contact columns wherein the nodule columns are interleaved with the electrical contact columns.

8. The socket apparatus of claim 7, wherein a nodule engages one electrical contact from one column of the pairs of electrical contacts while engaging another electrical contact from another column of the pairs of electrical contacts.

9. The socket apparatus of claim 1, comprising a cam member mounted on a side opposite the base member from the extension members, the cam member configured to push the first plate member and second plate member away from each other.

10. The socket apparatus of claim 1, comprising at least one screw member affixed to the socket apparatus to move at least one of the first plate member and second plate member relative to each other.

11. The socket apparatus of claim 1, wherein the balls of the BGA are secured to the socket apparatus by lateral forces applied by the corresponding electrical contacts.

12. The socket apparatus of claim 1, wherein the nodules are substantially round.

13. The socket apparatus of claim 1, wherein the nodules are substantially triangular.

14. A method of securing a ball grid array (BGA) to a socket comprising:
   a base member of electrically insulative material;
   an array of pairs of electrical contacts disposed in the base member in a configuration corresponding to a terminal ball configuration of said BGA to be mated with the socket;
   a first plate member disposed for slidable movement on said base member and having a plurality of parallel extension members extending and configured to pass through the array of pairs of electrical contacts;

a second plate member disposed for slidable movement on said base member and having a plurality of parallel extension members extending therefrom and configured to pass through the array of pairs of electrical contacts;

the plurality of parallel extension members of said first plate member disposed between the parallel extension members of said second plate member;

a plurality of insulative nodules disposed on each extension member with nodules forming an array corresponding to said array of pairs of electrical contacts; and the first plate member and second plate member being movable relative to each other on said base member whereby the plurality of insulative nodules urge the corresponding electrical contacts into electrical contact engagement with the balls of the BGA in the socket;

the method comprising:

placing the BGA into the socket; and moving the first plate member and second plate member are relative to each other to urge the corresponding electrical contacts into electrical contact engagement with the balls of the BGA and secure the BGA to the socket.

15. The method of claim 14, wherein at least one of the first and second plate members is moved using a cam member.

16. The method of claim 14, wherein at least one of the first and second plate members is moved using a screw member.

17. The method of claim 14, comprising securing the balls of the BGA to the socket by lateral forces applied by the corresponding electrical contacts.

18. The method of claim 14, wherein the slidable movement is along a lengthwise direction of the extension members.

19. The method of claim 14, comprising flexing the electrical contacts when the electrical contacts are contacted by the nodules.

20. The method of claim 14, wherein the extension members and nodules are made of an insulating material.

* * * * *